United States Patent [19]
Flora

[11] 4,376,275
[45] Mar. 8, 1983

[54] VERY FAST BCD-TO-BINARY CONVERTER

[75] Inventor: Laurence P. Flora, Covina, Calif.

[73] Assignee: Burroughs Corporation, Detroit, Mich.

[21] Appl. No.: 250,865

[22] Filed: Apr. 3, 1981

[51] Int. Cl.³ .......................................... H03K 13/24
[52] U.S. Cl. ............................. 340/347 DD; 235/311
[58] Field of Search ............... 340/347 DD; 235/310, 235/311

[56] References Cited
U.S. PATENT DOCUMENTS
3,163,859 12/1964 Stowe ................................. 235/310

Primary Examiner—C. D. Miller
Attorney, Agent, or Firm—Nathan Cass; Kevin R. Peterson; David G. Rasmussen

[57] ABSTRACT

A very fast BCD-to-binary converter useful for addressing a digital memory. The converter includes a logical level comprised of at least three specially chosen AND-OR-INVERT integrated circuit gates, having at least five inputs, for producing binary output signals representing bits of the converted binary number.

11 Claims, 3 Drawing Figures

CONVERTER
20

FIG. 3.

| X3 | Y3 | Z3 | M3 | M4 | M5 | M6 | M7 | M8 | M9 |
|---|---|---|---|---|---|---|---|---|---|
| 0 | 0 | 0 | $\overline{Z_1}$ | $\overline{Z_2}$ | $\overline{Y_1}$ | $\overline{Y_2}$ | $\overline{X_1}$ | $\overline{X_2}$ | 1 |
| 0 | 0 | 1 | $\overline{Y_1}$ | $\overline{Y_2}$ | 1 | 1 | $\overline{X_1}$ | $\overline{X_2}$ | 0 |
| 0 | 1 | 0 | $\overline{Z_1}$ | $Z_2$ | 0 | 1 | $\overline{X_1}$ | $\overline{X_2}$ | 0 |
| 0 | 1 | 1 | 1 | 1 | 0 | 0 | $\overline{X_1}$ | $\overline{X_2}$ | 0 |
| 1 | 0 | 0 | $\overline{Z_1}$ | $\overline{Z_2}$ | 1 | 0 | $\overline{Y_1}$ | $\overline{Y_2}$ | 0 |
| 1 | 0 | 1 | 0 | 1 | 0 | 0 | $\overline{Y_1}$ | $\overline{Y_2}$ | 0 |
| 1 | 1 | 0 | 1 | 0 | 0 | 0 | $\overline{Z_1}$ | $\overline{Z_2}$ | 0 |
| 1 | 1 | 1 | 0 | 0 | 0 | 0 | 1 | 1 | 0 |

TRUTH TABLE

VERY FAST BCD-TO-BINARY CONVERTER

BACKGROUND OF THE INVENTION

This invention relates generally to improved means and methods for providing very fast binary coded decimal (BCD) to binary conversion, and more particularly to providing such BCD-to-binary conversion in connection with the addressing of a digital memory.

Recent advances in integrated circuit technology have made possible significant increases in the speed of operation of digital computers. As a result, there has been increased emphasis on developing very fast BCD-to-binary converters which will not deleteriously affect the speed of data processing operations.

Various known approaches for providing BCD-to-binary conversion are disclosed in the articles: "A Method for High Speed BCD-to-Binary Conversion", L. C. Beougher, Computer Design, March 1973, pp. 53–59; "Binary-to-Decimal Conversion with Complex IC Functions", J. R. Linford, Computer Design, September 1970, pp. 53–61; and "Storage Efficient Representation of Decimal Data", Tien Chi Chen, Communications of the ACM, January 1975, Vol. 18, No. 1, pp. 49–52.

BCD-to-binary approaches specifically directed to providing BCD-to-binary conversion in connection with the addressing of a memory are, for example, disclosed in U.S. Pat. Nos. 3,160,872 and 3,618,047; in the article E. J. Lengyel et al., "Direct Decimal to Binary Address Generator for Small Memories", IBM Technical Disclosure Bulletin, Vol. 9, No. 10, March 1967; and also in the commonly assigned copending patent application Ser. No. 118,490, filed Feb. 4, 1980 for "Circuit for Addressing Binarily Addressable Memories with BCD Addresses", H. Potash, inventor, now U.S. Pat. No. 4,334,213.

BCD-to-binary converters, such as disclosed above, are not fast enough to meet the high speed requirements of many current high speed computers now under development so that a need exists for faster BCD-to-binary converters. This is a particular problem with regard to memory addressing, since the time required for conversion directly impacts on the memory access time. Accordingly, it is a primary object of the present invention to provide a relatively simple, very fast BCD-to-binary converter which is particularly useful for addressing a digital memory.

SUMMARY OF THE PRESENT INVENTION

Initially, it is significant to recognize that there are many types of available very fast integrated circuits (for example, AND, OR, NAND, NOR, multiplexers, etc.) which can be logically combined to provide a BCD-to-binary conversion. However, the actual speed of conversion achieved by a particular combination of very fast integrated circuits is highly dependent upon the particular configuration employed and the number of logic levels employed as well as on the speed of the individual integrated circuits. Furthermore, consideration has to be given to the cost of the configuration chosen to implement the conversion.

In the light of the foregoing, it is to be understood that the present invention resides in the provision of a BCD-to-binary converter which is particularly useful for addressing a digital memory and which achieves a very high speed conversion at relatively low cost. This is achieved by employing a novel configuration which uses as a basic logical element a specially chosen AND-OR-INVERT integrated circuit gate which can be configured to provide a very fast BCD-to-binary conversion.

The specific nature of the invention as well as other objects, features, uses and advantages thereof will become evident from the following detailed description of a preferred embodiment in conjunction with the following drawings.

BRIEF DESCRIPTION OF THE DRAWINGS

FIG. 3 illustrates a truth table.

DETAILED DESCRIPTION

Like numerals and characters refer to like elements throughout the figures of the drawings.

Figure 1:
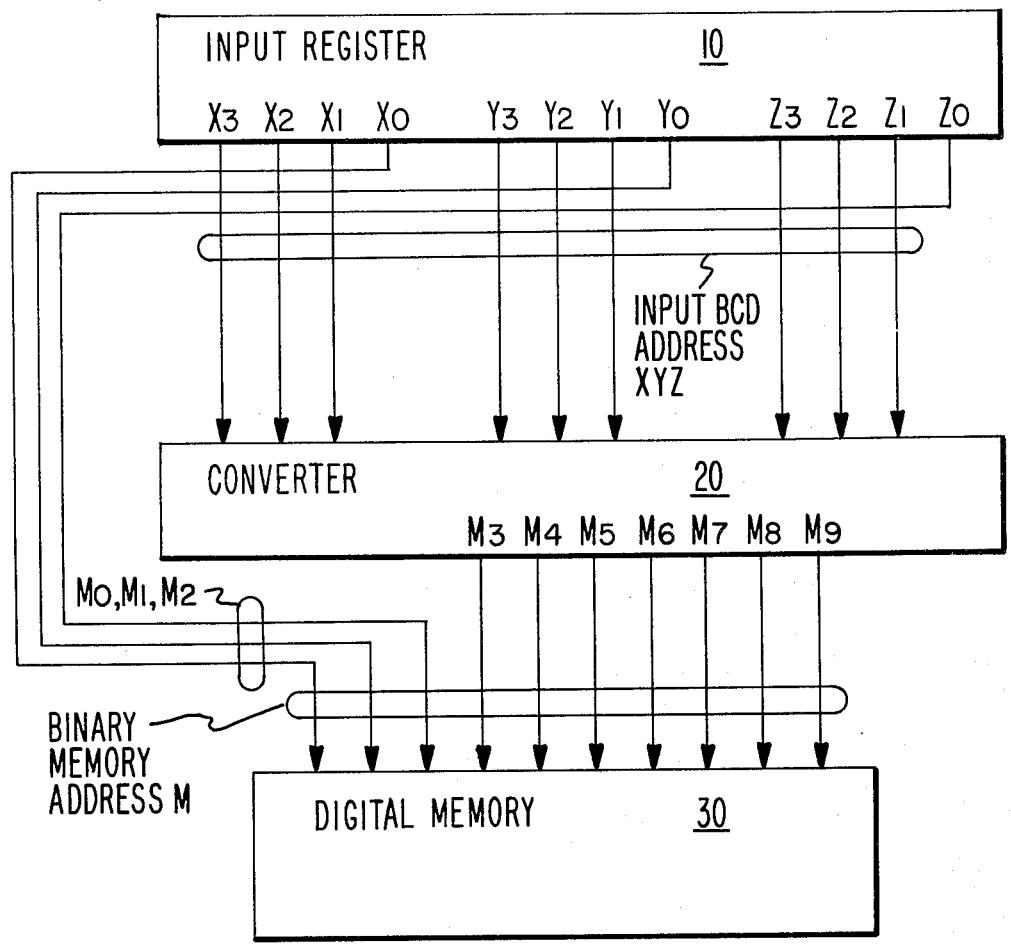
FIG. 1 illustrates the overall BCD to binary converter.

FIG. 1 generally illustrates an example of memory addressing circuitry incorporating the present invention. As shown, the individual bits $X_0$, $X_1$, $X_2$, $X_3$, $Y_0$, $Y_1$, $Y_2$, $Y_3$ and $Z_0$, $Z_1$, $Z_2$, $Z_3$ of a three digit BCD memory address XYZ are stored in an input register 10. The respective least significant bits $X_0$, $Y_0$ and $Z_0$ of each of the digits X, Y and Z are directly applied as bits $M_0$, $M_1$ and $M_2$ of the converted binary address to the digital memory 30. This is a well known expedient provided in BCD-to-binary memory address conversion circuitry which avoids having to convert these least significant bits $X_0$, $Y_0$ and $Z_0$ (see the aforementioned U.S Pat. No. 3,160,872).

As illustrated in FIG. 1, the remaining bits $X_1$, $X_2$, $X_3$, $Y_1$, $Y_2$, $Y_3$ and $Z_1$, $Z_2$, $Z_3$ of the input BCD address XYZ are converted by converter 20 into binary address bits $M_3$, $M_4$, $M_5$, $M_6$, $M_7$, $M_8$ and $M_9$ which together with the directly applied binary bits $M_0$, $M_1$ and $M_2$ constitute the converted binary address M which is used to address the digital memory 30.

It will be understood that, for memory addressing purposes, it is not important that the converted binary address M be a true binary equivalent of the input BCD address. The only important requirement is that the converted binary address M constituted by the bits $M_3$–$M_9$ provided by the converter 20 taken in conjunction with the directly applied bits $M_0$–$M_2$ define a unique location in the digital memory 30 for each applied BCD address. It will also be understood that the time required for the converter 20 to perform its conversion of BCD bits $X_1$, $X_2$, $X_3$, $Y_1$, $Y_2$ $Y_3$ and $Z_1$, $Z_2$, $Z_3$ into binary bits $M_3$–$M_9$ determines the overall speed of BCD-to-binary conversion, since the least significant BCD bits $A_0$, $B_0$ and $C_0$ require no conversion.

Figure 2:
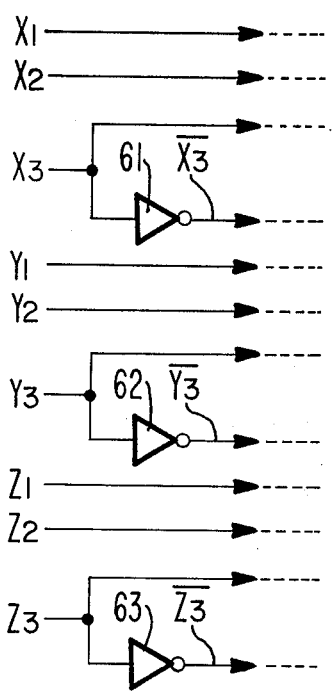
FIG. 2 illustrates the converter item 20 of FIG. 1.
Figure 2:
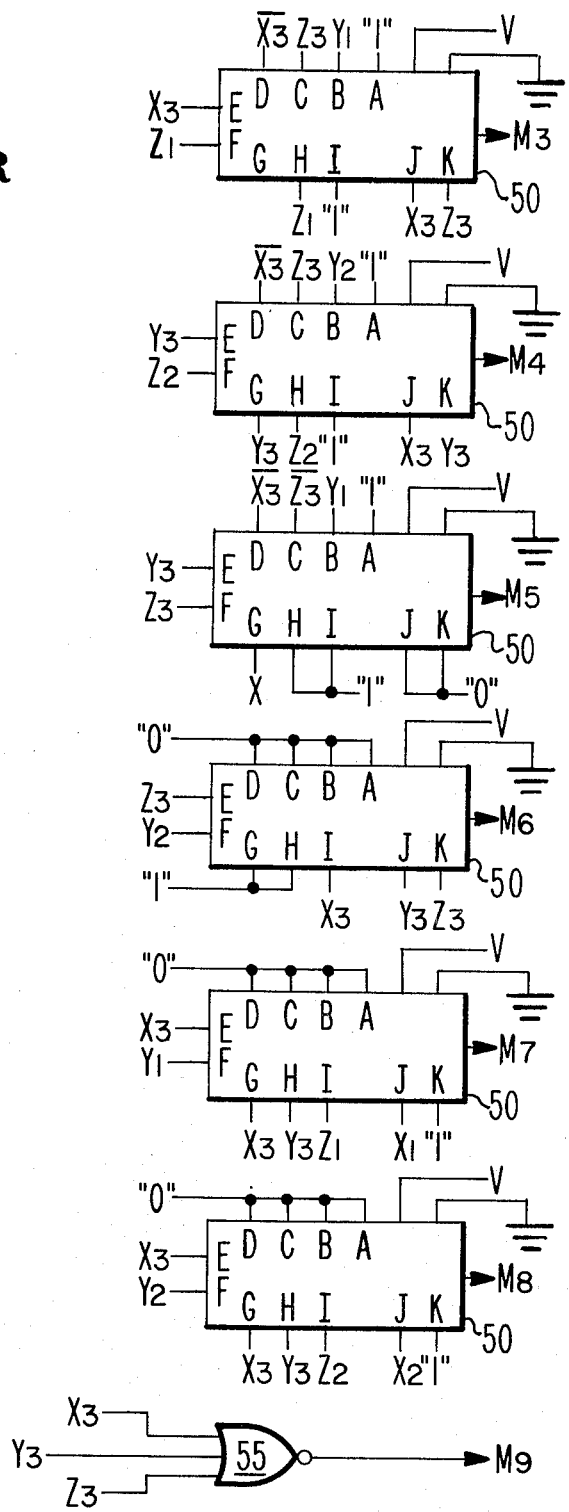

Reference is now directed to FIG. 2 which illustrates a preferred embodiment of the converter 20 in FIG. 1. In order to achieve a very fast conversion, the converter 20 employs as a basic element a specially chose integrated circuit 50 which will hereinafter be referred to as an AND-OR-INVERT gate. Six of these gates 50 are illustrated in FIG. 2. Such an AND-OR-INVERT gate 50 is commercially available as a single integrated circuit chip from National Semiconductor Corporation which denotes this gate by the designation 74S64, the characteristics of the gate being set forth in the 1976 National Semiconductor TTL Data Book, pages 1-16, 1-56 and 1-57. It will be noted that a worst-case delay of 5.5 nanoseconds is indicated for this 74S64 AND-OR-INVERT gate.

The function provided by each AND-OR-INVERT gate 50 in FIG. 2 can be represented by the following Boolean equation:

$$V = \overline{ABCD + EF + GHI + JK}$$

wherein A, B, C, D, E, F, G, H, I, J, and K are eleven inputs which may be applied to gate 50.

In accordance with the present invention, it has unexpectedly been found that these AND-OR-INVERT gates 50 can be configured (as illustrated, for example, in FIG. 2) in a single logical level arrangement for performing the major (if not the entire) portion of the logical operations required by the BCD-to-binary converter 20 in FIG. 1. The additional logical circuitry (if any) required for the complete logical operations will depend upon the number of input BCD digits provided and the particular logic employed for implementing the conversion.

In the particular BCD-to-binary embodiment illustrated in FIG. 2, a two-level configuration is provided wherein three inverters 60, 61 and 62 are provided at a first logical level and a NOR gate 55 and six AND-OR-INVERT gates 50 are provided at a second logical level. The NOR gate 55 may, for example, be provided by one of the three NOR gates contained on a National Semiconductor 74S27 integrated circuit chip, and the three inverters 61, 62 and 63 may be provided by three of the six inverters contained on a National Semiconductor 74S04 integrated circuit chip. Of course, an AND-OR-INVERT gate 50 could also be used for the NOR gate 55 in FIG. 2, but it is usually less expensive to use the NOR gate 55.

Considering now the speed of conversion of the particular embodiment illustrated in FIG. 2, it will be evident that the worst-case propagation time for the logical level comprising six National Semiconductor AND-OR-INVERT gates 50 and NOR gate 55 is 5.5 nanoseconds, since gate 50 provides a worst-case delay of 5.5 nanoseconds and NOR gate 55 provides a worst-case delay of 5 nanoseconds. When the worst-case delay of 5 nanoseconds for the first logical level of inverters 61, 62 and 63 is added, the total worst-case delay for the converter 20 in FIG. 2 is then 10.5 nanoseconds (assuming a 15 picofarad load) which is significantly faster than known BCD-to-binary converters.

The converter 20 of FIG. 2 will now be considered in further detail. For the particular implementation shown in FIG. 2, the first level which is comprised of the three inverters 61, 62 and 63 merely inverts the three BCD bits $X_3$, $Y_3$ and $Z_3$, while passing the other BCD bits unchanged. The signals applied to the second level which is comprised of NOR gate 55 and the six AND-OR-INVERT gates 50 are thus the twelve signals: $X_1$, $X_2$, $X_3$, $\overline{X_3}$; $Y_1$, $Y_2$, $Y_3$, $\overline{Y_3}$; and $Z_1$, $Z_2$, $Z_3$, $\overline{Z_3}$. The particular ones of these twelve signals which are applied to the NOR gate 55 and each of the six AND-OR-INVERT gates 50 are indicated in FIG. 2 by the signals shown applied to the inputs of each of these gates.

With regard to each of the AND-OR-INVERT gates 50 in FIG. 2, it will be understood that the letters A through K shown for each gate 50 correspond to the eleven inputs of the previously presented equation for V representing the function implemented by each AND-OR-INVERT gate 50. It will also be understood that, in order to conform to this equation for V, particular ones of these A through K inputs of each AND-OR-INVERT gate 50 have "1" or "0" signals applied thereto. Also, each gate 50 in FIG. 2 illustrates the supply voltage V and ground connections applied thereto.

The resulting relationships between the inputs applied to the NOR gate 55 and each of the AND-OR-INVERT gates 50 in FIG. 2 and their respective outputs $M_3$ to $M_9$ can be represented by the following Boolean equations:

$$M_3 = \overline{\overline{X_3}Z_3Y_1 + \overline{X_3}Z_1 + \overline{Y_3}Z_1 + X_3Z_3}$$

$$M_4 = \overline{\overline{X_3}Z_3Y_2 + \overline{X_3}Z_2 + \overline{Y_3}Z_2 + X_3Y_3}$$

$$M_5 = \overline{\overline{X_3}\overline{Z_3}Y_1 + X_3Z_3 + Y_3}$$

$$M_6 = \overline{\overline{Z_3}Y_2 + X_3 + Y_3Z_3}$$

$$M_7 = \overline{\overline{X_3}Y_1 + \overline{X_3}Y_3Z_1 + X_1}$$

$$M_8 = \overline{\overline{X_3}Y_2 + \overline{X_3}Y_3Z_2 + X_2}$$

$$M_9 = \overline{X_3 + Y_3 + Z_3}$$

As an aid to understanding the above Boolean equations, reference is directed to FIG. 3 which illustrates the TRUTH TABLE implemented by these equations. A careful examination of this TRUTH TABLE will demonstrate that a unique binary number M will be obtained for application to the digital memory 30 (FIG. 1) in response to each input BCD number XYZ.

It is to be understood that the invention can be adapted to handle different numbers of BCD digits as well as varying sizes of digital memories. Accordingly, it will be appreciated that different numbers of these AND-OR-INVERT gates 50 illustrated in FIG. 2 may be employed in the converter 20, and also that each AND-OR-INVERT gate (whose function is represented by the equation V previously presented herein) can be varied to provide different numbers of inputs as well as different numbers of AND functions to be ORed and then INVERTed. For the purposes of the present invention, a minimum logical configuration for the converter 20 includes at least three AND-OR-INVERT gates 50, wherein each AND-OR-INVERT gate includes the following characteristics: (1) the gate is provided on a single integrated circuit chip; (2) the gate has an input capability of at least five input signals; (3) the gate is capable of ORing at least two different logical functions of the inputs; (4) at least one of the ORed functions includes an AND combination of at least two inputs; (5) the gate output corresponds to the INVERTed ORed result; and (6) the gate provides a worst-case delay of no greater than 7 nanoseconds. Accordingly, a minimum-size AND-OR-INVERT gate in accordance with the invention may, for example, provide five inputs A, B, C, D and E which, for example, may logically be combined in accordance with one of the following illustrative equations:

$$V_1 = \overline{AB + CD + E} \text{ or}$$

$$V_2 = \overline{ABC + DE} \text{ or}$$

$$V_3 = \overline{AB + C + D + E} \text{ or}$$

$$V_4 = \overline{ABCD + E}$$

It will thus be apparent that the embodiment presented herein is subject to a wide variety of modifications and variations in construction, arrangement and use without departing from the scope of this invention. Accordingly, the present invention is to be considered as including all possible modifications and variations encompassed within the scope of the appended claims.

What is claimed is:

1. In apparatus for converting a plurality of BCD binary signals representing a plurality of BCD digits into a plurality of binary signals representing an output binary number, the combination comprising:

a plurality of at least three AND-OR-INVERT gates provided at the same logical level, each AND-OR-INVERT gate having the following characteristics:
  (1) the gate is provided on a single integrated circuit chip;
  (2) the gate has an input capability of at least five input signals;
  (3) the gate is capable of ORing at least two different logical functions of the inputs;
  (4) at least one of the ORed functions includes an AND combination of at least two inputs;
  (5) the gate output corresponds to the INVERTed ORed result; and
  (6) the gate provides a worst-case delay of no greater than 7 nanoseconds;

logic means responsive to particular ones of said BCD binary signals for applying a predetermined plurality of binary signals to each of said AND-OR-INVERT gates such that each AND-OR-INVERT gate provides a binary output signal corresponding to a different one of the binary signals representing said binary number.

2. The invention in accordance with claim 1, wherein the BCD binary signals corresponding to the least significant BCD binary signals of said BCD digits are directly employed as binary signals of said output binary number.

3. The invention in accordance with claim 2, including a digital memory to which the binary signal outputs of said AND-OR-INVERT gates along with the directly provided binary signals are applied as address binary signals.

4. The invention in accordance with claim 1, wherein at least one AND-OR-INVERT gate has less than five inputs applied thereto, and wherein each unused input has a "1" or "0" binary signal applied thereto as determined by the particular function performed on the inputs by the respective AND-OR-INVERT gate.

5. The invention in accordance with claim 2, wherein said logic means comprises a single level of logic.

6. The invention in accordance with claim 5, wherein said logic means operates to invert particular ones of said BCD binary signals.

7. The invention in accordance with claim 6, wherein said single level of logic comprises a plurality of inverters.

8. The invention in accordance with claim 1, 2, 3, 4, 5, 6 or 7, wherein said apparatus comprises only two logical levels, wherein said logic means is one logical level, and wherein the logical level including said AND-OR-INVERT gates is the other logical level.

9. The invention in accordance with claim 8, wherein the logical level including said AND-OR-INVERT gates includes a NOR gate which receives a particular plurality of binary signals from said logic means.

10. The invention in accordance with claim 9, wherein three BCD digits are applied to said apparatus, wherein said one logical level comprises three inverters, and wherein said other logical level comprises six AND-OR-INVERT gates and one NOR gate.

11. The invention in accordance with claim 8, wherein at least three BCD digits are applied to said apparatus, and wherein said other logical level comprises at least six AND-OR-INVERT gates.

* * * * *